(12) United States Patent
Nguyen et al.

(10) Patent No.: US 7,088,140 B1
(45) Date of Patent: Aug. 8, 2006

(54) HIGH SPEED IO BUFFER USING AUXILIARY POWER SUPPLY

(75) Inventors: Khai Nguyen, San Jose, CA (US); Chiakang Sung, Milpitas, CA (US); Gopi Rangan, Milpitas, CA (US); Tzung-Chin Chang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/794,987

(22) Filed: Mar. 4, 2004

(51) Int. Cl.
*H03K 19/0175* (2006.01)
(52) U.S. Cl. .......................... 326/81; 326/68
(58) Field of Classification Search ................. 326/81; 327/534
See application file for complete search history.

(56) References Cited

U.S. PATENT DOCUMENTS

| | | | |
|---|---|---|---|
| 5,128,560 A | * | 7/1992 | Chern et al. .................. 326/81 |
| 5,953,261 A | * | 9/1999 | Furutani et al. ........ 365/189.05 |
| 6,208,167 B1 | * | 3/2001 | Ranjan et al. ................. 326/81 |
| 6,369,613 B1 | * | 4/2002 | Costello et al. ............... 326/83 |

* cited by examiner

*Primary Examiner*—James H. Cho
(74) *Attorney, Agent, or Firm*—J. Matthew Zigmant; Townsend and Townsend and Crew LLP

(57) ABSTRACT

Circuits, methods, and apparatus that provide output drivers that consume relatively little integrated circuit area and provide fast output switching. An exemplary embodiment provides an output driver including pull-up and pull-down devices, each device driven by a pre-driver stage. The pre-driver for the pull-down device is supplied from an auxiliary power supply, which has a higher voltage than the supply seen by the pull-up device. The pre-driver for the pull-down is biased by a voltage that tracks the higher of the auxiliary and output supplies. In some embodiments, the output driver may be part of an input/output cell. In that case, the well for the pull-up device is biased by a voltage that tracks the highest of the output supply and input received voltage, while the pull-up predriver circuit bias is the higher between the auxiliary and output supplies and the input received voltage.

18 Claims, 7 Drawing Sheets

HIGH SPEED IO BUFFER USING AUXILIARY POWER SUPPLY

BACKGROUND

The present invention relates to input/output (IO) cells in general and to high speed IO cells using an auxiliary power supply in particular.

A goal in integrated circuit manufacturing is to increase circuit density and functionality. Accordingly, there has been a great deal of effort put into reducing the size of individual transistors so that more transistors, and thus more functionality, can be placed on each device.

There is a downside to these higher densities and smaller devices. For example, smaller devices can only standoff or support a limited voltage before breakdown occurs. Higher densities can result in an increase in power supply dissipation per unit area of an integrated circuit, which can limit operability and lifetime, as measure in mean time before failure, of the circuit. To mitigate both these consequences, the power supply voltages applied to integrated circuits has been progressively lowered over the years, from 5 volts to 3.3, then to 2.5 and recently 1.8 volts and even lower.

This reduction in power supply voltage has taken its toll on some of the individual circuits that are used in the design and manufacture of integrated circuits. One type of circuit that has been particularly effected are output drivers. The reduction in supply voltage has meant a corresponding decrease in their drive capability.

To compensate for this, the size of output devices has often been increased. This has the undesirable results of consuming more die area for the output drivers, and also necessitate the increase in size of predriver circuits that drive the output drivers themselves. The increase in size of these circuits increases their power supply currents, thus offsetting some of the gains achieved by having the smaller devices and lower power supplies in the first place. Alternately, a slower output driver may be used, but these outputs are more susceptible to noise and jitter.

Accordingly, what is needed are circuits, methods, and apparatus that provide fast output drivers using lower power supplies but do not require large integrated circuit areas for their implementation.

SUMMARY

Accordingly, embodiments of the present invention provide circuits, methods, and apparatus that provide output drivers that consume relatively little integrated circuit area and provide fast output switching. An exemplary embodiment provides an output driver including pull-up and pull-down devices, each device driven by a pre-driver stage. The pre-driver for the pull-down device is supplied from an auxiliary power supply that has a higher voltage than the supply seen by the pull-up device. The pre-driver for the pull-down is biased by a voltage that tracks the higher of the auxiliary and output supplies. In some embodiments, the output driver may be part of an input/output cell. In that case, the well for the pull-up device is biased by a voltage that tracks the highest of the output supply and input received voltage, while the pull-up predriver circuit bias is changed to the higher between the auxiliary and output supplies and the input received voltage. Various embodiments of the present invention may incorporate one or more of these and the other features discussed herein.

A better understanding of the nature and advantages of the present invention may be gained with reference to the following detailed description and the accompanying drawings.

DESCRIPTION OF EXEMPLARY EMBODIMENTS

Figure 1:
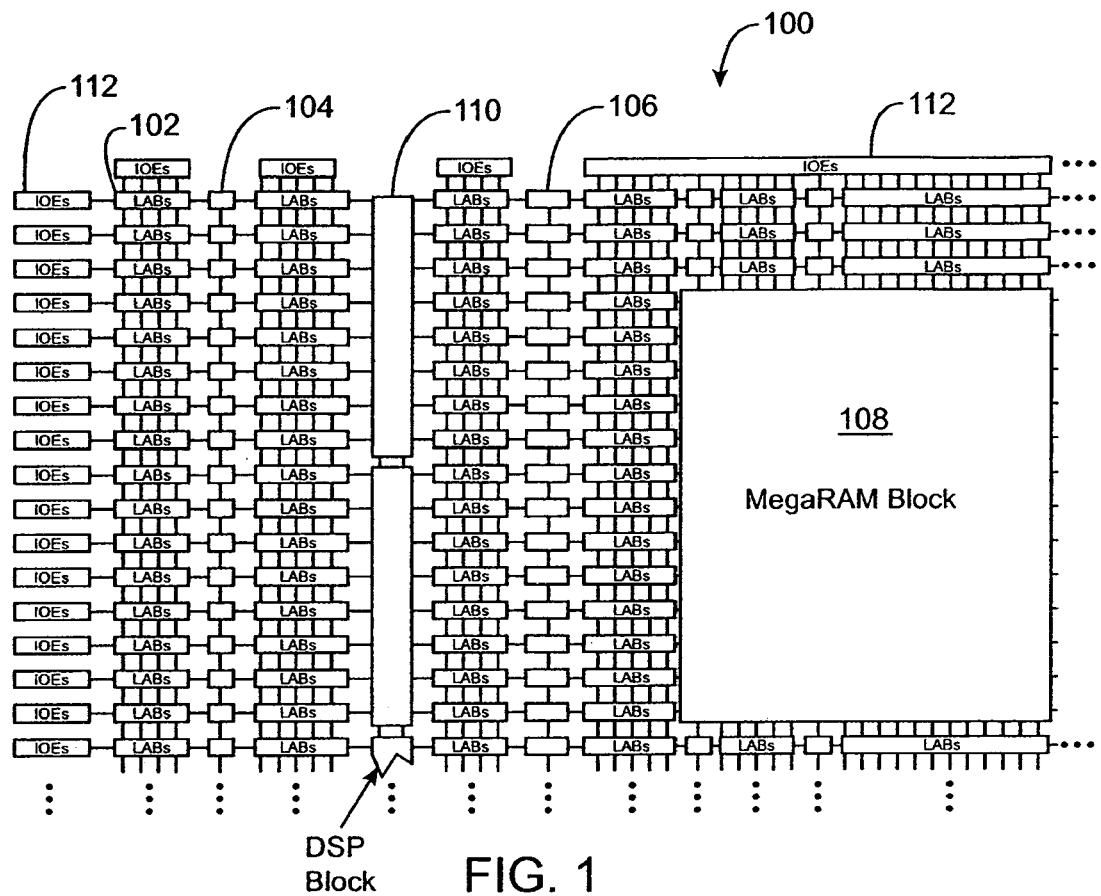
FIG. 1 is a simplified block diagram of a programmable logic device that can implement embodiments of the present invention.

FIG. 1 is a simplified partial block diagram of an exemplary high-density programmable logic device 100 wherein techniques according to the present invention can be utilized. PLD 100 includes a two-dimensional array of programmable logic array blocks (or LABs) 102 that are interconnected by a network of column and row interconnects of varying length and speed. LABs 102 include multiple (e.g., 10) logic elements (or LEs), an LE being a small unit of logic that provides for efficient implementation of user defined logic functions.

PLD 100 also includes a distributed memory structure including RAM blocks of varying sizes provided throughout the array. The RAM blocks include, for example, 512 bit blocks 104, 4K blocks 106 and a M-Block 108 providing 512K bits of RAM. These memory blocks may also include shift registers and FIFO buffers. PLD 100 further includes digital signal processing (DSP) blocks 110 that can implement, for example, multipliers with add or subtract features. I/O elements (IOEs) 112 located, in this example, around the periphery of the device support numerous single-ended and differential I/O standards. It is to be understood that PLD 100 is described herein for illustrative purposes only and that the present invention can be implemented in many different types of PLDs, FPGAs, and the like.

Figure 2:
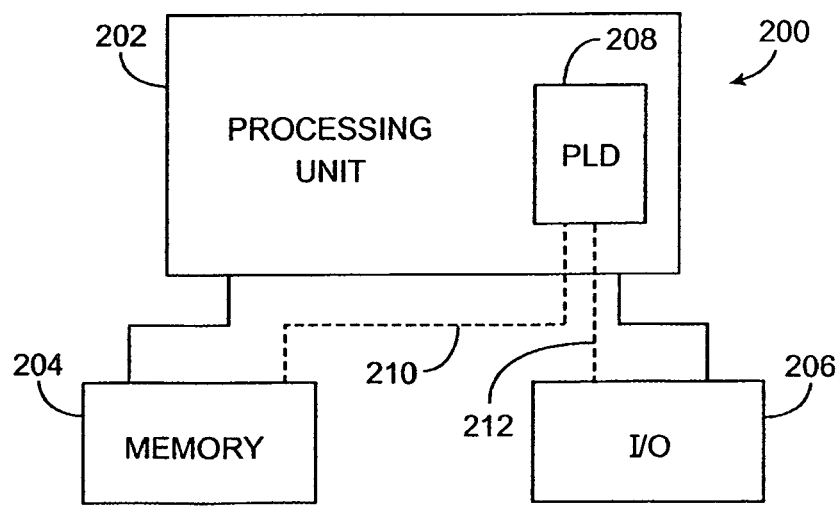
FIG. 2 is a block diagram of an electronic system that may incorporate embodiments of the present invention.

While PLDs of the type shown in FIG. 1 provide many of the resources required to implement system level solutions, the present invention can also benefit systems wherein a PLD is one of several components. FIG. 2 shows a block diagram of an exemplary digital system 200, within which the present invention may be embodied. System 200 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 200 may be provided on a single board, on multiple boards, or within multiple enclosures.

System 200 includes a processing unit 202, a memory unit 204 and an I/O unit 206 interconnected together by one or more buses. According to this exemplary embodiment, a programmable logic device (PLD) 208 is embedded in processing unit 202. PLD 208 may serve many different purposes within the system in FIG. 2. PLD 208 can, for example, be a logical building block of processing unit 202, supporting its internal and external operations. PLD 208 is programmed to implement the logical functions necessary to carry on its particular role in system operation. PLD 208 may be specially coupled to memory 204 through connection 210 and to I/O unit 206 through connection 212.

Processing unit 202 may direct data to an appropriate system component for processing or storage, execute a program stored in memory 204 or receive and transmit data via I/O unit 206, or other similar function. Processing unit 202 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 208 can control the logical operations of the system. In an embodiment, PLD 208 acts as a reconfigurable processor, which can be reprogrammed as needed to handle a particular computing task. Alternately, programmable logic device 208 may itself include an embedded microprocessor. Memory unit 204 may be a random access memory (RAM), read only memory (ROM), fixed or flexible disk media, PC Card flash disk memory, tape, or any other storage means, or any combination of these storage means.

Figure 3:
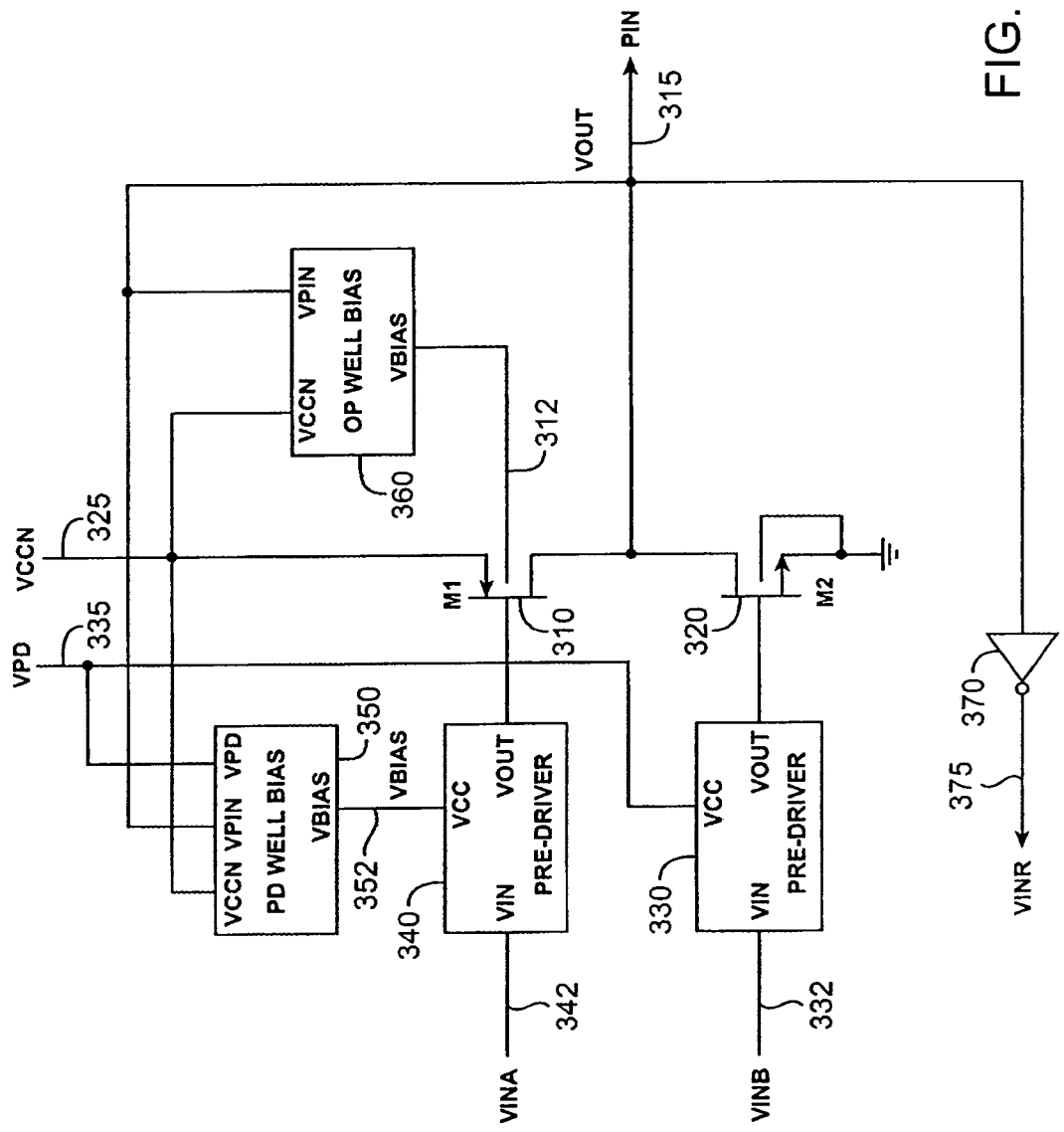
FIG. 3 is a schematic of an input/output (I/O) cell consistent with an embodiment of the present invention.

FIG. 3 is a schematic of an input/output cell that is consistent with an embodiment of the present invention. This I/O cell may be used as the I/O cell 112 in FIG. 1, or as an I/O cell in other integrated circuits. This figure, as with the other included figures, is shown for illustrative purposes only and does not limit either the possible embodiments of the present invention or the claims.

Include are output driver devices M1 310 and M2 320, pre-drivers 330 and 340, PD well bias circuit 350, output well bias circuit 360, and optional input receiver or buffer 370. When the optional input receiver 370 is removed, this circuit is an output cell. When the optional input receiver 370 is included, the circuit forms an IO cell.

When configured as an output cell, the output may be active or tristated. For example, when configured as an output, the output pin VOUT on line 315 may be connected to a tristate bus, and the output cell may need to be tri-stated on occasion. When configured as an IO cell, the circuit may act as an input or an output. When the circuit is receiving signals as a input, the output portion of the circuit is tristated. Again, when the circuit is an output, the output may be active or tristated.

When the circuit is acting as an active output, whether as an output cell or an IO cell, an input signal VINA is received on line 342 from the integrated circuit internal core. Also, a signal VINB, which may be the same signal as VINA, is received on line 332 from the core. VINA (and VINB) is typically a logic signal that swings between the power supply voltages in the core of the integrated circuit. Often, these voltages are kept low to reduce the power dissipation for the integrated circuit, for example the core voltages may be 1.2 volts and ground. Pre-driver 330 translates its input signal to a logic signal having a high-voltage approximately equal to the voltage applied at VPD on line 335, and a low voltage approximately equal to ground. Pre-driver 340 translates its input signal to logic signal having a high-voltage approximately equal to the higher of the voltage applied at VPD on line 335 and VCCN on line 325, and a low voltage approximately equal to ground.

The input signal VINA (and VINB) is buffered by the pre-drivers 340 and 330, the outputs of which drive pull-up device M1 310 and pull-down device M2 320. The drains of M1 310 and M2 320 connect to line 315. Typically, line 315 connects to a pad, which in turn connects to a pin of the integrated circuit device package. The source of M1 310 connects to a supply VCCN, which is 1.8 volts in a specific embodiment of the present invention. The source of M2 320 connects to ground. In this mode, the output well bias circuit 360 connects the well of the pull up device M1 310 to VCCN.

To improve the switching performance of the circuit when it is an active output, the pre-driver 330 supply voltage is supplied by a separate supply, VPD on line 335. By using the higher supply VPD on line 335 to bias the pre-driver 330, a larger drive is seen at the gate of M2 320. This larger gate translates to a larger VGS (specifically, the maximum value of VGS is equal to VPD), and hence a larger pull-down current for device M2 320 when it is on. The pre-driver 340 is biased by the higher of the supply voltages, VCCN and VPD. A higher voltage here does not translate to a performance improvement to the same degree. Since the source of M1 is tied to VCCN on line 325, the maximum VGS for M1 310 is still VCCN, the larger swing simply shuts off M1 310.

When the output cell is tristated, either because the cell is configured as an IO cell and it is acting as an input, or it is configured as an output but tristated, VINA on line 342 and VINB on line 332 are separate signals. In this case, the input VINA on line 342 is high, such that the gate of the pull-up driver M1 310 is high, and M1 310 is off, and the input VINB on line 332 is low, such that gate of the pull-down driver M2 320 is low and M2 320 is off.

When the cell is acting as an input, an input signal is received on line 315 and buffered by input buffer 370. Input buffer 370 is typically supplied by the core voltage power supplies. In this configuration, conventional cells are susceptible to problems is the parasitic drain-to-bulk diode of the pull-up device M1 310 turns on. Specifically, if the input voltage on line 315 exceeds the voltage VCCN on line 325 by a diode drop (approximately 0.7 volts) and the well of the pull-up device M1 310 is tied to VCCN on line 325, the drain-to-bulk diode of M1 310 conducts current from the input line 315 to VCCN on line 325. To avoid this, the output well bias circuit biases the well of M1 310 to the higher voltage between VCCN on line 325 and the received signal on line 315.

It will be appreciated by one skilled in the art that although this figure illustrates circuitry operating between positive power supplies and ground, other power supply schemes are possible consistent with embodiments of the present invention. For example, these circuits may operate between ground and one or more negative supplies. Alternately, the circuit may operate between on or more positive power supplies and one or more negative power supplies, and may also possibly include ground.

Also, this and the following figures show circuitry as being made of CMOS devices. In other embodiments, other processes, such as bipolar, BiCMOS, HFETs, HBTs, and other processes and technologies may be used consistent with the present invention.

Figure 4:
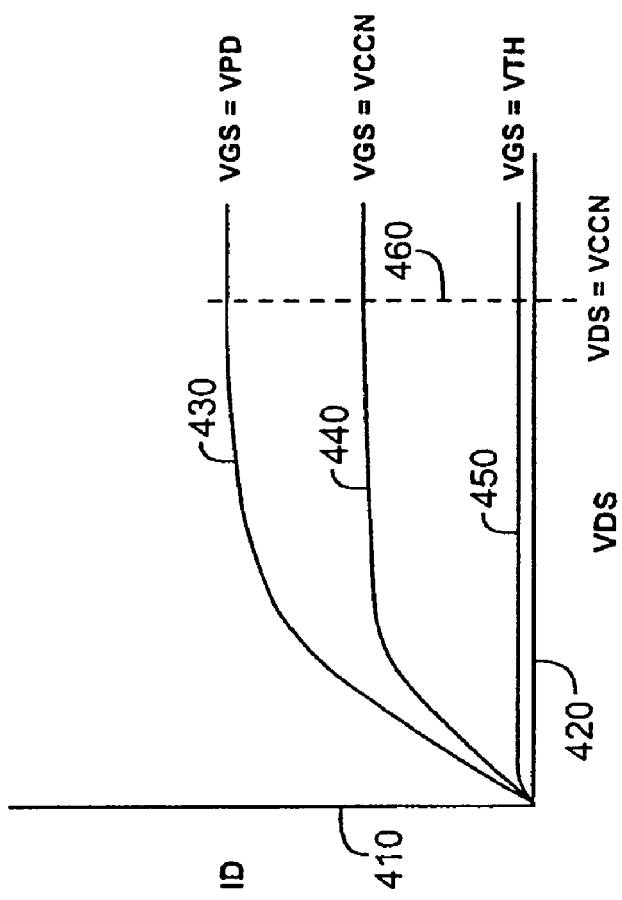
FIG. 4 is a plot illustrating drain current as a function of drain-to-source voltage for different drain-to-gate voltages for an NMOS transistor.

FIG. 4 is a plot illustrating drain current as a function of drain-to-source voltage for different drain-to-gate voltages for an NMOS transistor, such as the pull-down transistor M2 320 in FIG. 3. Drain current Id is plotted along a Y-axis 410 as a function of VDS along an X-axis 420. Trace 450 illustrates how zero, or near zero drain current flows when VGS is approximately equal to the threshold voltage Vth for the device. As VGS is increased, for example to VCCN, trace 440 indicates that a higher current flows at a corresponding VDS. As VGS is further increased, for example to VPD, the drain current increases further, as indicated by trace 430.

In this way, the higher VGS provided to the pull-down driver M2 320 in FIG. 3 results in a larger pull-down current in that device. This advantage may be used in one of two ways. The device size may be kept large, in which case the switching speed is improved. Alternately, device size may be reduced while maintaining similar switching characteristics. Often, a compromise between these two may be desirable, where the device sizes reduced and switching performance is improved, but both to a lesser degree.

Figure 5:
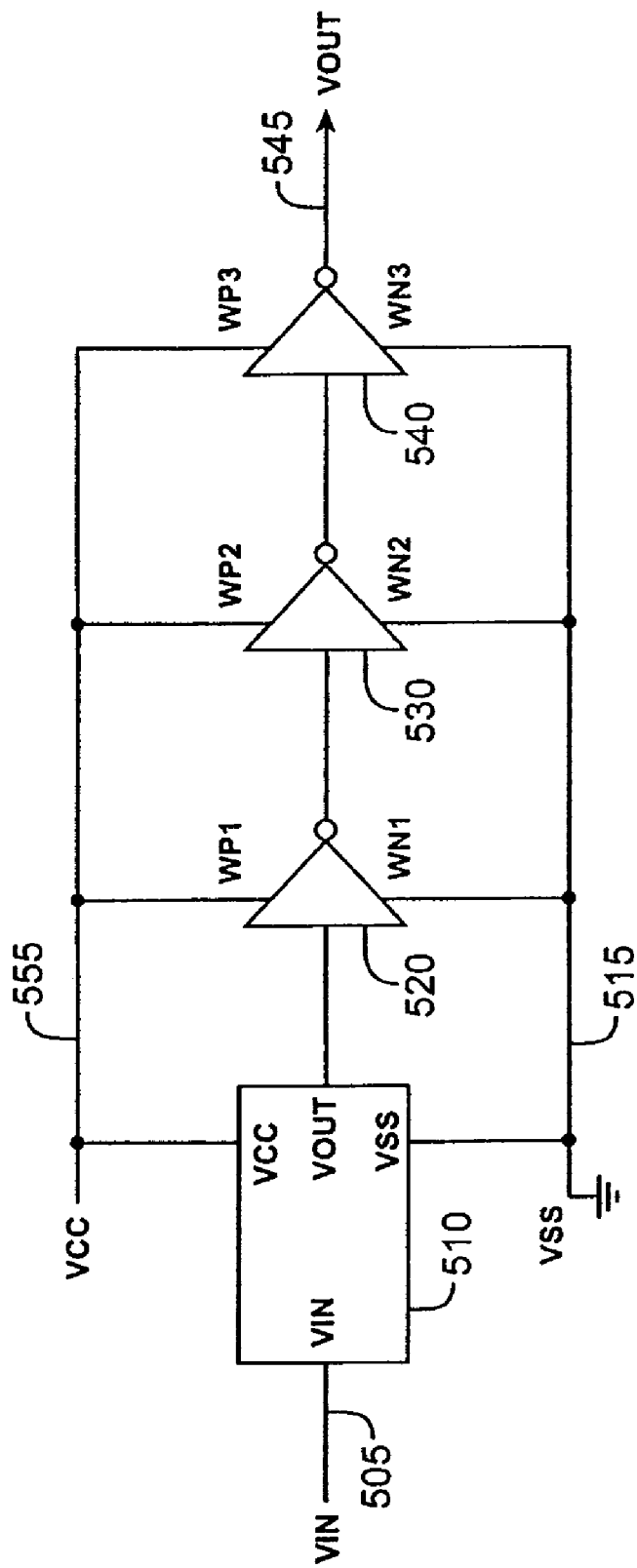
FIG. 5 is a schematic of a pre-driver that may be used as the pre-drivers in FIG. 3, or as a pre-driver in other embodiments of the present invention.

FIG. 5 is a schematic of a pre-driver that may be used as the pre-drivers 330 and 340 in FIG. 3, or as a pre-driver in other embodiments of the present invention. Include are level shift circuit 510 and inverters 520, 530, and 540.

An input signal is received on line 505 by the level shift circuit 510. Typically, this signal operates in a voltage range provided to the core of the integrated circuit. For example, the input may be a digital signal operating between 1.2 volts and ground. The level shift circuit 510 translates this signal to a signal operating between VCC on line 555 and ground on line 515. This signal is then buffered by inverters 520, 530, and 540. Inverter 540 provides an output voltage VOUT on line 545.

The buffers 520, 530, and 540 typically increase progressively in size, with inverter 520 being the smallest and inverter 540 being the largest. A typical ratio of device widths is on the order of 3:1 to 5:1. In a specific embodiment of the present invention, this ratio is approximately 4:1. In this way, a signal with a comparatively low drive is boosted in power, until it is capable of driving a large output device. Each of the inverters 520, 530, and 540 typically are formed of a series of a p-channel and n-channel coupled between VCC on line 555 and ground on line 515. The gates of the p-channel and n-channel devices both connect to the input, while the drains of the devices tie together to form the output.

Typically the p-channel device in an inverter has a longer width than the n-channel. This is to compensate for differences in the mobility of the majority carriers between the p-channel and n-channel devices. By adjusting the widths of the devices to compensate for differences in mobility, the threshold voltage of the inverter remains near one-half of VCC. In a specific embodiment however, this is not desirable, since the output of the level shift circuit 510 is asymmetrical. In this specific embodiments, the lengths of the p and n-channel inverter 520 is close to a 1:2 ratio. This moves the threshold for the inverter closer to ground to compensate for the asymmetry in the voltage swing at the output of the level shift 510. In this embodiment the lengths of devices in inverter 530 are very close to 1:1, while the ratio of devices in inverter 540 have approximately a 3:1 ratio.

Again, VCC for the pre-driver 330 is equal to VPD. This voltage is typically higher than the core power supply, or the output supply VCCN. In this way, a greater swing is provided to the n-channel pull down driver M2 320 in FIG. 3.

Figure 6:
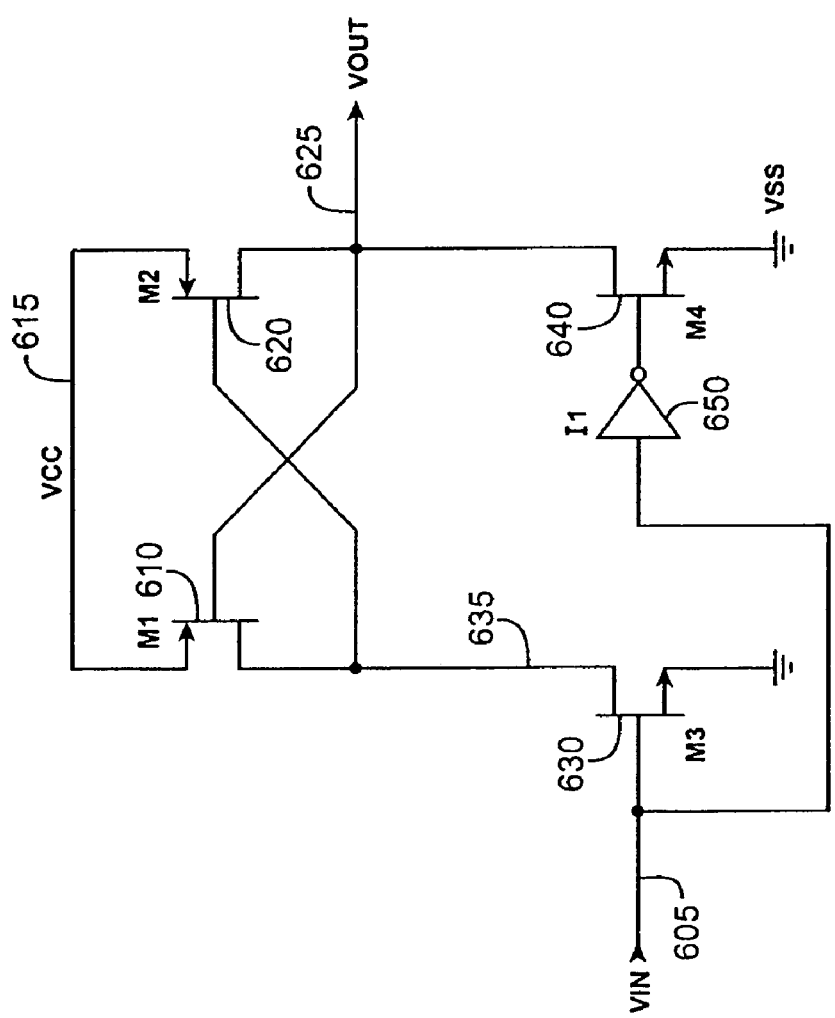
FIG. 6 is a schematic of a level shift circuit that may be used as the level shift circuit in FIG. 5, or as a level shift circuit in other embodiments of the present invention.

FIG. 6 is a schematic of a level shift circuit that may be used as the level shift circuit 510 in FIG. 5, or as a level shift circuit in other embodiments of the present invention. Included are p-channel transistors M1 610 and M2 620, n-channel devices M3 630 and M4 640, and inverter I1 650.

An input signal VIN is received on line 605. Again, this signal is typically provided by a core logic element LE in logic array block LAB 102. This input signal typically transitions between a high voltage and a low voltage, for example, 1.2 volts and ground. The level shift circuit provides an output VOUT on line 625. The output VOUT on line 625 swings between a voltage VCC applied on line 615 and ground.

The input signal VIN on line 605 drives the gates of n-channel device M3 630 and inverter I1 650. Inverter I1 650 inverts the signal VIN on line 605 and drives the gate of M4 640. When the input VIN on line 605 is high, device M3 630 is on, while device M4 640 is off. Device M3 630 conducts current, thus pulling down the gate of device M2 620. The device M2 620 in turn pulls VOUT on line 625 to the voltage VCC applied on line 615. When the input voltage VIN on line 605 his low, device M3 630 is off, while device M4 640 is on. Device M4 440 pulls VOUT on line 645 to ground. The devices M1 610 and M2 620 are crossed coupled to provide positive feedback for faster switching.

The inverter I1 650 may be powered by the core voltage or by the voltage VCC applied on line 615. In a specific embodiment, I1 650 is powered by VCC on line 615. This means that device M3 630 and M4 440 receive different input voltages. For this reason, M4 440 receives a stronger drive, thus resulting in a lower average voltage for VOUT on line 625. For this reason, the inverters driven by the output VOUT on line 645 have their input thresholds set low to compensate.

Figure 7:
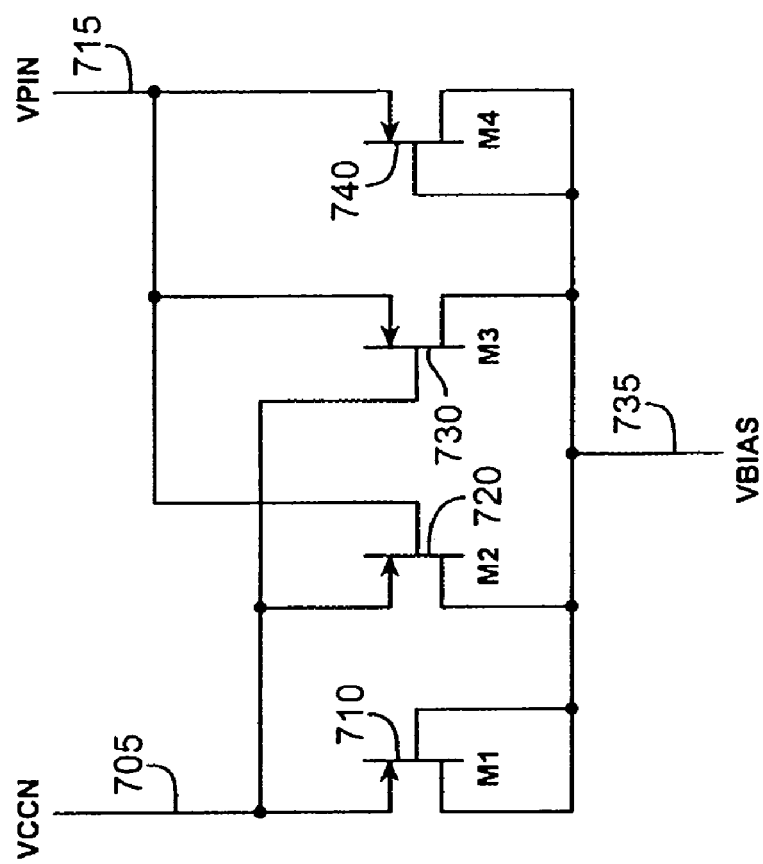
FIG. 7 is a schematic of an output well-bias circuit that may be used as the output well-bias circuit 360 in FIG. 3, or as an output well-bias circuit in other embodiments of the present invention.

FIG. 7 is a schematic of an output well-bias circuit that may be used as the output well-bias circuit 360 in FIG. 3, or as an output well-bias circuit in other embodiments of the present invention. Included are p-channel devices M1 710, M2 720, M3 730, and M4 740.

Again, this is circuit tracks the higher of voltage between VCCN on line 705 and VPIN on line 715. If the two voltages are equal, or within a threshold voltage of each other, the bias voltage VBIAS on line 735 is set by the diodes M1 710 or M4 740. If the difference between the voltage VCCN on line 705 and VPIN on line 715 is greater than a threshold voltage, one of the devices M2 720 or M3 730 shorts VBIAS on line 735 to it the respective voltage line.

Specifically, when VCCN on line 705 is higher than VIN on line 715 by more than a threshold voltage, device 720 conducts and shorts VCCN on line 705 to VBIAS on line 735. Conversely, if VPIN on line 715 is higher than VCCN on line 705 by more than a threshold voltage, device M3 730 conducts, thus shorting VPIN on line 715 to VBIAS 735. In this way, the well of pull-up device M1 310 is sufficiently high such that an excess received voltage at the pad VOUT on line 315 does not cause conduction in its drain-to bulk diode.

A table listing exemplary voltages for VCCN on line 705 and VPIN on line 715, and the resulting voltage for VBIAS on line 735 follows:

| VCCN | VPIN | VBIAS |
|------|------|-------|
| 1.5  | 2.5  | 2.5   |
| 1.8  | 2.5  | 2.5   |
| 1.8  | 1.8  | 1.8-$V_{TP}$ |
| 2.5  | 1.8  | 2.5   |
| 2.5  | 1.5  | 2.5   |

Where $V_{TP}$ is the threshold voltage for a p-channel device.

Figure 8:
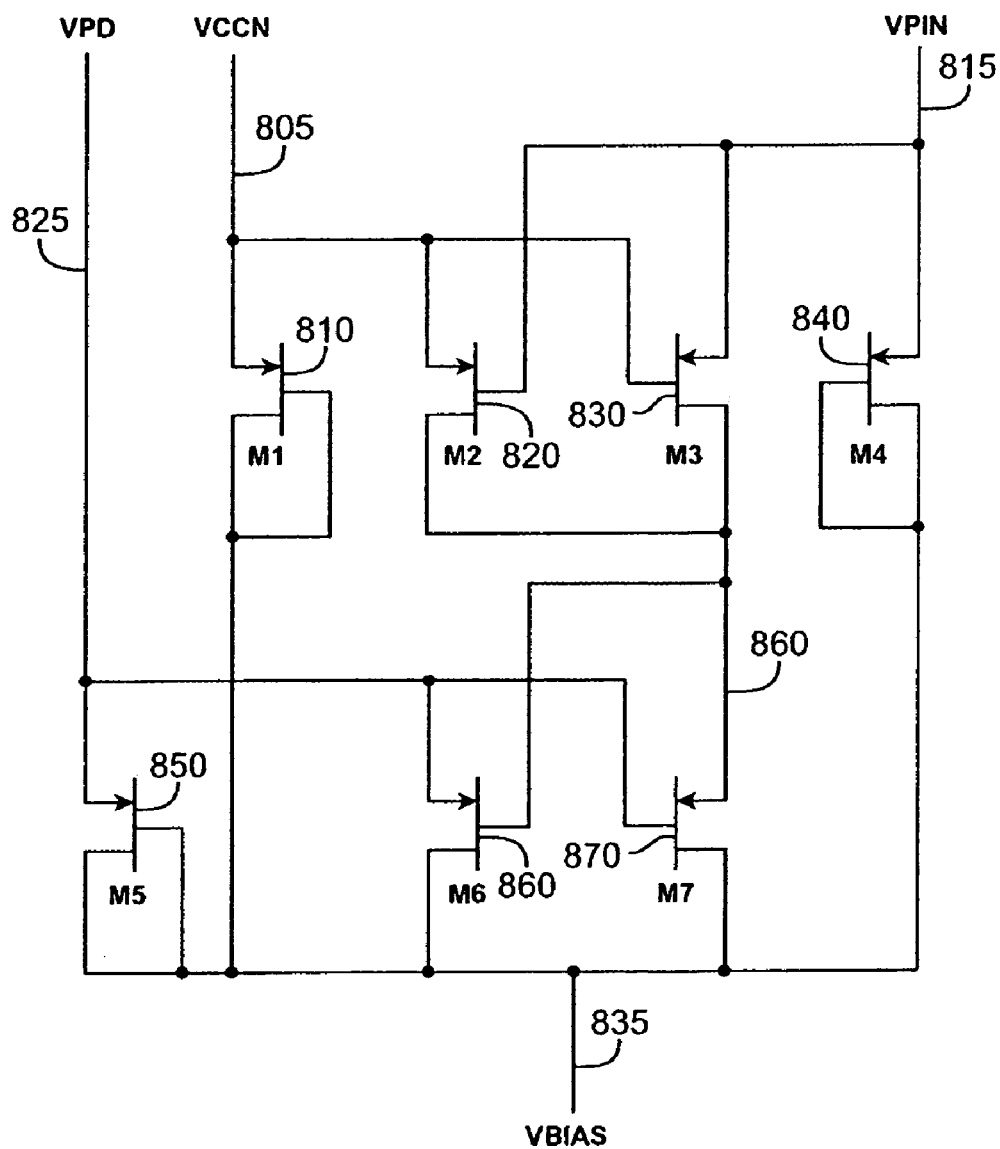
FIG. 8 is a schematic of a pre-driver well-bias circuit that may be used as the pre-driver well-bias circuit 350 in FIG. 3 or as a pre-driver well-bias circuit in other embodiments of the present invention.

FIG. 8 is a schematic of a pre-driver well-bias circuit that may be used as the pre-driver well-bias circuit 350 in FIG. 3 or as a pre-driver well-bias circuit in other embodiments of the present invention. Included are P-channel devices M1 810, M2 820, M 830, M4 840, M5 850, M6860, and M7870.

Devices M1 810, M2 820, M3 830, and M4 840 operate similarly as described regarding the output well-bias circuit in FIG. 7. Additionally, VPD on line 825 is received by this circuit. In some embodiments of the present invention, this circuit is used to bias both in the pre-driver 340 and the well of the output pull up device M1 310.

When VPD on line 825 is higher than the voltages VCCN on line 805 or VPIN on line 815, which is often the case, device M6 860 conducts, thus shorting VPD on line 825 to VBIAS on line 835. If the voltage VPD on line 825 is lower than other the voltages VCCN on line 805 or VPIN on line 815, then the voltage at the intermediate node 860 in shorted to VBIAS on line 835. In this case, the intermediate voltage on line 860 is set as before by VCCN on line 805 and VPIN on line 815. If two or more of the voltages VPD on line 825, VCCN on line 805 and VPIN on line 815 are within a threshold voltage of each other (and higher than the remaining voltage, if applicable), then VBIAS is approximately a threshold voltage below the highest voltage level.

A table listing exemplary voltages for VPD on line 825, VCCN on line 805 and VPIN on line 815, and the resulting voltage VBIAS on line 835 follows:

| VPD | VCCN | VPIN | VBIAS |
|-----|------|------|-------|
| 1.5 | 1.5  | 2.5  | 2.5   |
| 1.8 | 1.5  | 2.5  | 2.5   |
| 1.8 | 1.5  | 1.8  | 1.8-$V_{TP}$ |
| 2.5 | 1.5  | 1.8  | 2.5   |
| 2.5 | 1.5  | 1.5  | 2.5   |

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit comprising:
   an output buffer comprising:
      a pull-up device coupled between a pad and a first supply voltage;
      a pull-down device coupled between the pad and a second supply voltage;
      a first pre-driver coupled to drive the pull-down device; and
      a second pre-driver coupled to drive the pull-up device,
   wherein the first pre-driver's power supplies comprise a third supply voltage and the second supply voltage, and the third supply voltage is higher than the first supply voltage, and
   wherein the second pre-driver's power supplies are a fourth supply voltage and the second supply voltage, and wherein the fourth supply voltage approximately tracks the highest voltage among a voltage at the pad, the first supply voltage, and the third supply voltage.

2. The integrated circuit of claim 1 wherein the first pre-driver circuit receives a signal from a logic circuit in the integrated circuit, wherein the logic circuit's power supplies comprise a fifth supply voltage and the second supply voltage, and the third supply voltage is higher than the fifth supply voltage.

3. The integrated circuit of claim 1 wherein a well of the pull-up device is biased by a well-bias circuit, and wherein the well-bias circuit approximately tracks the higher of the first supply voltage and the voltage at the pad.

4. The integrated circuit of claim 3 wherein the well-bias circuit tracks the higher of the first supply voltage and the voltage at the pad to approximately within a p-channel device's threshold voltage.

5. The integrated circuit of claim 1 wherein the second supply voltage is ground.

6. The integrated circuit of claim 1 wherein the integrated circuit further comprises an input buffer coupled to the pad.

7. An integrated circuit comprising:
   a plurality of core circuits, the plurality of core circuits operating between a first power supply and a second power supply;
   a first pre-driver coupled to at least one of the plurality of core circuits, the first pre-driver operating between a third power supply and the second power supply;
   a second pre-driver, the second pre-driver operating between a fourth power supply and the second power supply; and
   an output inverter coupled to the first predriver, the second pre-driver, and a pad, the output inverter operating between a fifth power supply and the second power supply,
   wherein the fourth power supply approximately tracks the highest voltage among a voltage on the pad, the third power supply, and the fifth power supply.

8. The integrated circuit of claim 7 wherein the output inverter comprises a p-channel device coupled between the fifth power supply and the pad, and an n-channel device coupled between the pad and the second power supply.

9. The integrated circuit of claim 8 wherein a well of the p-channel device in the output inverter is biased by an output of a well-bias circuit, and the output of the well-bias circuit approximately tracks the higher voltage between the fifth power supply and the voltage on the pad.

10. The integrated circuit of claim 7 wherein the second power supply is ground.

11. The integrated circuit of claim 7 wherein the third power supply provides power only to a plurality of pre-drivers.

12. The integrated circuit of claim 7, wherein the integrated circuit is a field-programmable gate array.

13. An integrated circuit comprising:
- a core logic circuit in a plurality of core circuits, the core logic circuit to provide a first logic signal transitioning between a first voltage level and a second voltage level;
- a first pre-driver circuit to receive the first logic signal and provide a second logic signal transitioning between a third voltage level and the second voltage level;
- a second pre-driver circuit to provide third logic signal transitioning between a fourth voltage level and the second voltage level; and
- an output inverter to receive the second logic signal and the third logic signal and provide a fourth logic signal on a pad and transitioning between a fifth voltage level and the second voltage level,
- wherein the third voltage level is higher than the first voltage level, and the third voltage level is higher than the fifth voltage level, and
- wherein the fourth voltage level approximately tracks the highest voltage level among a voltage level on the pad, the third voltage level, and the fifth voltage level.

14. The integrated circuit of claim 13 wherein the output inverter comprises a p-channel device coupled to receive the fifth voltage level and also coupled to the pad, and an n-channel device coupled to the pad and further coupled to receive the second voltage level.

15. The integrated circuit of claim 14 wherein a well of the p-channel device in the output inverter is biased by an output of a well-bias circuit, and the output of the well-bias circuit approximately tracks the higher voltage level between the fifth voltage level and the voltage level on the pad.

16. The integrated circuit of claim 15 wherein the well-bias circuit tracks the higher voltage level between the fifth voltage level and the voltage level on the pad to approximately within a p-channel device's threshold voltage.

17. The integrated circuit of claim 15 wherein the first pre-driver further comprises a level shift circuit, wherein the level shift circuit translates a first signal transitioning between the first voltage level and the second voltage level to a second signal transitioning between the third voltage level and the second voltage level.

18. The integrated circuit of claim 17 wherein the second voltage level is ground.

* * * * *